United States Patent [19]

Iguchi

[11] Patent Number: 5,442,714

[45] Date of Patent: Aug. 15, 1995

[54] DESIGN RULE CHECKING METHOD AND A METHOD OF FABRICATING A PHASE SHIFT MASK

[75] Inventor: Katsuji Iguchi, Yamatokoriyama, Japan

[73] Assignee: Sharp Kabushiki Kaisha, Osaka, Japan

[21] Appl. No.: 989,799

[22] Filed: Dec. 9, 1992

[30] Foreign Application Priority Data

Dec. 11, 1991 [JP] Japan .................. 3-327822

[51] Int. Cl.⁶ .................. G06K 9/00; G01B 11/00
[52] U.S. Cl. .................. 382/144; 324/501; 348/126; 356/394; 364/491
[58] Field of Search .................. 382/1, 8; 364/488–491; 348/126; 356/394; 324/66, 501

[56] References Cited

U.S. PATENT DOCUMENTS 4,774,461  9/1988  Matsui et al. .................. 356/394
5,270,796  12/1993  Tokui et al. .................. 356/394

OTHER PUBLICATIONS

M. D. Levenson et al., *IEEE Transactions on Electron Devices*, vol. ED-29, No. 12, pp. 1828–1836, Dec. 1982, "Improving Resolution in Photolithography With A Phase-Shifting Mask".

*Primary Examiner*—Leo H. Boudreau
*Attorney, Agent, or Firm*—Nixon & Vanderhye

[57] ABSTRACT

In a design rule checking method of the invention, pattern data for forming one layer is divided into two types of pattern data for an A layer and a B layer. Then, A rules to be satisfied by the pattern data for the A layer, B rules to be satisfied by the pattern data for the B layer, and AB rules to be satisfied by a combination of the two types of pattern data for the A and B layers are established. Then, based on the established rules, it is checked to see whether the pattern data for the A layer satisfies the A rules, whether the pattern data for the B layer satisfies the B rules and whether the combination of the two types of pattern data for the A and B layers satisfies the AB rules.

20 Claims, 4 Drawing Sheets

DESIGN RULE CHECKING METHOD AND A METHOD OF FABRICATING A PHASE SHIFT MASK

BACKGROUND OF THE INVENTION

1. Field of the Invention

The present invention relates to a design rule checking method, and more particularly to a design rule checking method applicable to a phase shift mask and a method of fabricating a phase shift mask.

2. Description of the Related Art

To produce a new semiconductor device, after the layout of the semiconductor device is designed, new masks used in lithographic processes are produced. Using these masks, the semiconductor device is fabricated. Pattern data for producing masks which includes units of pattern data for every layer of the fabrication process is produced as a final result of the layout design. Thereafter, design rule checking is performed so as to check whether or not the pattern data includes any errors, prior to the production of the masks. More specifically, in design rule checking, the pattern data for each layer is checked whether or not it satisfies design rules which define the minimum dimension or tolerance limit prescribed by a fabrication process technique, the degree of accuracy of registration of respective layers, and the like. If a new fabrication process technique is developed, new design rules may be required.

Recently, a lithographic technique using a phase shift mask has been proposed as a method for improving resolution in an optical lithographic technique. The term "resolution" refers to how small the line width and space width of a resist pattern can be made by a lithographic technique. As a method for improving resolution, a Levenson type phase shift mask is proposed (Levenson, M. D. et al., IEEE Transaction on Electron Devices, vol. ED-29, no. 12, pp. 1828-1836, December 1982).

A phase shift mask has a film, which is called a phase shifter, for shifting the phase of an exposure light on part of the mask. The degree of phase shift can be changed by adjusting the refractive index and thickness of the phase shifter. It is known that two beams of light having different phases can interfere with each other. For example, if two beams of light of equal intensity but which have phases shifted by 180 degrees from each other are superposed, the intensity of the composite light becomes zero.

The Levenson type phase shift mask utilizes the above principle. In other words, the phases of two beams of light which are transmitted through adjacent light transmitting portions are different by 180 degrees from each other. Therefore, the light is prevented from diffusing out into the shielding portion between the two light transmitting portions due to a diffraction effect. The light transmitting portion is a portion of the mask pattern produced based on pattern data through which light is transmitted. In the case where an edge of a phase shifter is positioned in the light transmitting portion, unwanted dark portions occur in the transmitted light due to interference. Therefore, the Levenson type phase shift mask is used for a negative resist in which it is not necessary to position the edge of the phase shifter in the light transmitting portion.

The phase shift mask of a single layer has a portion where two beams of light, which are transmitted through adjacent light transmitting portions, have the same phase, and a portion where two beams of light which are transmitted through adjacent light transmitting portions have different phases from each other. In the latter portion where two beams of light which are transmitted through the adjacent light transmitting portions have different phases from each other, a resist pattern with a high resolution can be formed as compared with the conventional resist pattern. On the other hand, in the other portion, the resolution is the same as in the prior art. Therefore, the minimum dimension realized by a lithographic technique is different from portion to portion of the phase shift mask of a single layer.

The software for performing a conventional design rule checking does not have a function capable of checking pattern data of such a phase shift mask. Accordingly, new software which is applicable to such a phase shift mask is required. However, in order to develop the new software, much time and money is required.

SUMMARY OF THE INVENTION

The design rule checking method of this invention, by which it checks whether pattern data for forming a layer satisfies design rules, includes the steps of: dividing the pattern data into two types of pattern data for an A layer and a B layer, respectively; establishing A rules to be satisfied by the pattern data for the A layer, B rules to be satisfied by the pattern data for the B layer, and AB rules to be satisfied by a combination of the two types of pattern data for the A and B layers; and checking whether the pattern data for the A layer satisfies the A rules, whether the pattern data for the B layer satisfies the B rules and whether the combination of the two types of pattern data for the A and B layers satisfies the AB rules.

In a preferred embodiment, a phase of light which is transmitted through a light transmitting portion defined by the pattern data for the A layer is shifted relative a phase of light which is transmitted through a light transmitting portion defined by the pattern data for the B layer by 180 degrees.

According to another aspect of the invention, a design rule checking method is provided for checking whether pattern data for forming a layer satisfies design rules. The pattern data includes two types of pattern data for an A layer and a B layer, respectively, and the method includes the steps of: establishing A rules to be satisfied by the pattern data for the A layer, B rules to be satisfied by the pattern data for the B layer, and AB rules to be satisfied by a combination of the two types of pattern data for the A and B layers; and checking whether the pattern data for the A layer satisfies the A rule, whether the pattern data for the B layer satisfies the B rules and whether the combination of the two types of pattern data for the A and B layers satisfies the AB rules.

In a preferred embodiment, a phase of light which is transmitted through a light transmitting portion defined by the pattern data for the A layer is shifted relative a phase of light which is transmitted through a light transmitting portion defined by the pattern data for the B layer by 180 degrees.

According to still another aspect of the invention, a method for fabricating a phase shift mask on a transmitting substrate is provided. The method includes the steps of: generating pattern data for a layer having at least one light transmitting portion and at least one light transmitting portion including a phase shift; dividing the pattern data into two types of pattern data for an A layer and a B layer, respectively, the pattern data for the A layer representing the at least one transmitting portion including a phase shift in said layer, and the pattern data for the B layer representing the at least one light transmitting portion in the layer; establishing A rules to be satisfied by the pattern data for the A layer, B rules to be satisfied by the pattern data for the B layer, and AB rules to be satisfied by a combination of the two types of pattern data for the A and B layers; checking whether the pattern data for the A layer satisfies the A rules, whether the pattern data for the B layer satisfies the B rules and whether the combination of the two types of pattern data for the A and B layers satisfies the AB rules; and fabricating a light transmitting portion with a phase shift defined by the pattern data for the A layer and a light transmitting portion defined by the pattern data for the B layer, respectively, on the transmitting substrate.

In a preferred embodiment, a phase of light which is transmitted through the light transmitting portion defined by the pattern data for the A layer is shifted relative the phase of light which is transmitted through a light transmitted portion defied by the pattern data for the B layer by 180 degree.

Thus, the invention described herein makes possible the advantages of (1) providing a design rule checking method by which pattern data of a phase shift mask can easily undergo the design rule checking with a conventional software for design rule checking, (2) providing a design rule checking method by which there is no need for developing a new software, so that time and money for development can be greatly saved, and (3) providing a method of fabricating a phase shift mask by which a phase shift mask can readily be fabricated using a conventional software for design rule checking and a conventional mask fabrication technique.

These and other advantages of the present invention will become apparent to those skilled in the art upon reading and understanding the following detailed description with reference to the accompanying figures.

DESCRIPTION OF THE PREFERRED EMBODIMENTS

Hereinafter, an example will be described in which a Levenson type phase shift mask is produced using a negative photoresist.

Figure 6:
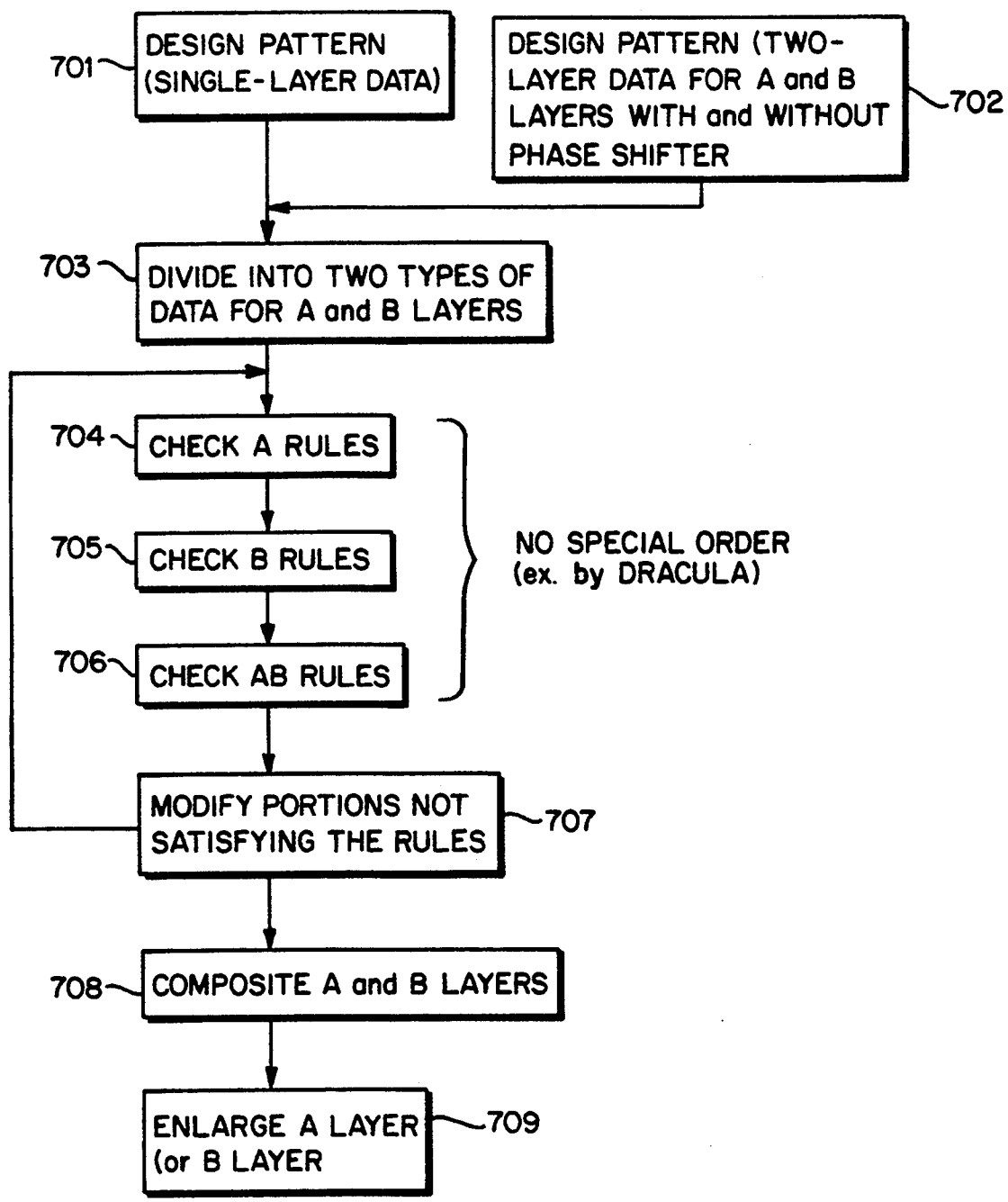
FIG. 6 is a flowchart illustrating the design rule checking method according to the example of the invention.

FIG. 6 is a flowchart illustrating a design rule checking method according to an example of the invention. The example of the invention is now described with reference to the flowchart of FIG. 6.

Figure 1:
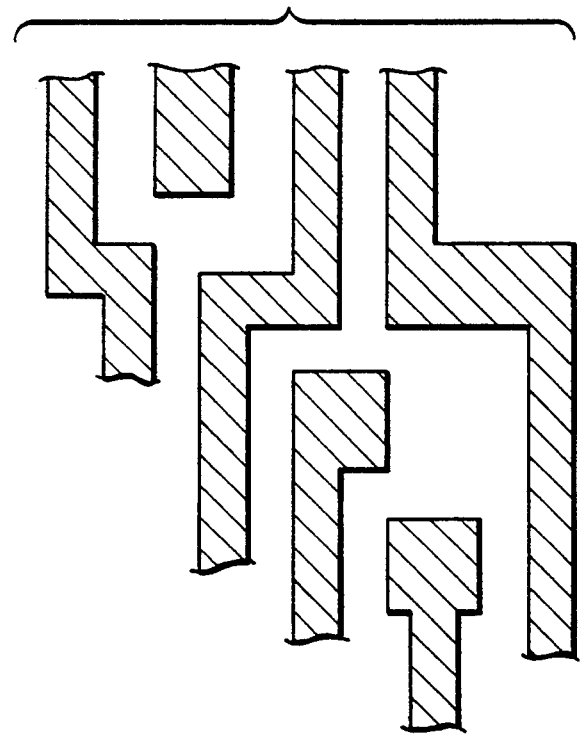
FIG. 1 represents a first step of a design rule checking method according to an example of the present invention.

First, in step 701, pattern data for a layer used in an exemplary fabrication process is designed with a conventional computer aided design (CAD) tool. FIG. 1 represents pattern data produced in accordance with step 701. In FIG. 1, the hatched portions represent the light transmitting portions.

Figure 2:
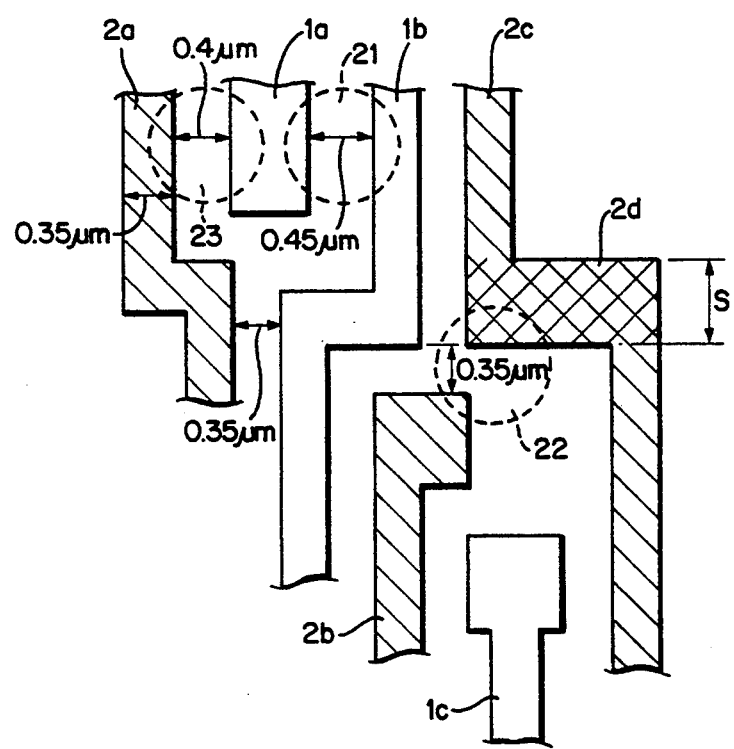
FIG. 2 represents a second step of the design rule checking method according to the example of the present invention.

Then, in step 703, the pattern data produced in step 701 is divided, nominally or otherwise, into two types of pattern data. More particularly, a first type of pattern data represents light transmitting portions on which a phase shifter will be formed. A second type of pattern data represents light transmitting portions on which a phase shifter will not be formed. The first type of pattern data is associated with an A layer including light transmitting portions 1a, 1b and 1c as is shown in FIG. 2. The second type of data is associated with a B layer including light transmitting portions 2a, 2b and 2c as is shown in FIG. 2. The A layer thereby consists of the light transmitting portions on which a phase shifter will be formed. The B layer thereby consists of the light transmitting portions on which no phase shifter is formed.

Now, design rules of the Levenson type phase shift mask are described. As described above, as is represented by a portion 21 in FIG. 2, a portion where two beams of light are transmitted through adjacent light transmitting portions having the same phase has the same resolution as that defined by a conventional optical lithographic technique. The resolution is determined, as an example, by a numerical aperture (NA) and a wavelength of exposure light of a stepper (a reduction-type projection printing); and by the characteristics of a resist material. For example, it is assumed that a stepper which has NA+0.5 and uses a light source of an i-line (wavelength: 365 nm) is employed and a negative photoresist is used. It is possible to form a resist pattern having a line width of 0.35 $\mu$m and a space width of 0.5 $\mu$m.

On the other hand, as is represented by a portion 23 in FIG. 2, a portion where two beams of light having different phases are transmitted through adjacent light transmitting portions has a resolution capable of forming a resist pattern having a line width of 0.35 $\mu$m and a space width of 0.35 $\mu$m. The reason can be explained as follows. If two beams of light having phases shifted by 180 degrees after transmission diffuse out into a shielding portion, the intensity of the diffusing light is zero. A region of the negative resist which is not exposed is eluted by developing. Therefore, the space width in the resist pattern is not enlarged.

In the above example, the pattern arrangement rules can be defined as follows:

|  | minimum line width | minimum space width |
| --- | --- | --- |
| same phases | 0.35 $\mu$m | 0.5 $\mu$m |

| | minimum line width | minimum space width |
|---|---|---|
| different phases | 0.35 μm | 0.35 μm |

The two types of pattern data are checked to see whether the data satisfy the above-mentioned design rules or not. First, in step 704 of FIG. 6, the pattern data for the A layer is checked to see whether it satisfies the design rules or not. All of the light transmitted through the light transmitting portions defined by the pattern data for the A layer passes through the phase shifter, so that the phase of all the light is shifted by 180 degrees. The pattern data for the A layer is checked based on the design rules for the same phase. This checking can be executed using conventional software for design rule checking. For example, the design rule checking can be performed using the DRACULA design checking software package available from Cadence Design Systems, Inc.

Then, in step 705, the pattern data for the B layer is checked to see whether it satisfies the design rules or not. The light transmitted through the light transmitting portions defined by the pattern data for the B layer will not pass through a phase shifter. The pattern data for the B layer is checked based on the design rule for the same phase, as in the case of the pattern data for the A layer. Then, in step 706, it is checked to see whether or not a combination of the two types of pattern data for the A and B layers satisfy the design rules. The phase of the light transmitted through the light transmitting portions defined by the pattern data for the A layer is shifted from the phase of the light transmitted through the light transmitting portions defined by the pattern data for the B layer by 180 degrees. Accordingly, the checking is based on the design rules for the different phases. The design rule checking in step 706 is also performed by using DRACULA. The order of these steps of design rule checking is not limited to the above order, which means that steps 704 to 706 may be performed in any order.

Figure 3:
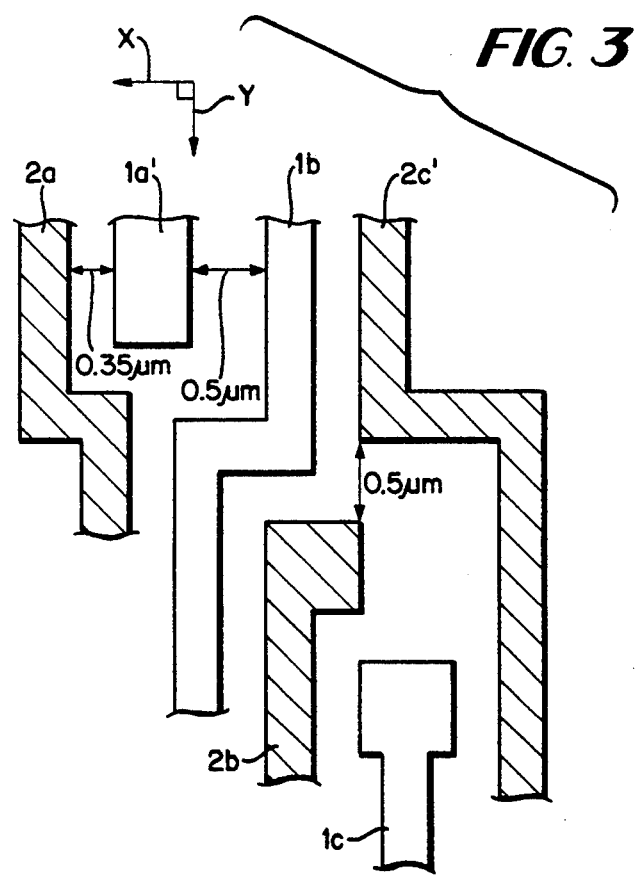
FIG. 3 represents a third step of the design rule checking method according to the example of the present invention.

In step 707 of FIG. 6, portions which do not satisfy the design rules are modified. As shown in FIG. 2, portions 21 and 22 indicated by broken lines do not satisfy the design rules. Therefore, the pattern data is modified in the following manner. The light transmitting portion 1a is moved by 0.05 μm in the direction indicated by the arrow X shown in FIG. 3, to be a light transmitting portion 1a'. The width S of a portion 2d in the light transmitting portion 2c is made smaller by 0.15 μm in the direction indicated by the arrow Y shown in FIG. 3. The light transmitting portion 2c including the modified portion 2d is referred to as a light transmitting portion 2c'. The modified pattern data is shown in FIG. 3.

After the pattern data is modified, as shown in FIG. 6, steps 704 to 706 are implemented again so as to check the modified pattern data for the A and B layers to see whether they satisfy the design rules or not. Thus, steps 704 to 707 are repeated, whereby the modification and the design rule checking for the pattern data are performed.

After completing the design rule checking, in step 708 of FIG. 6, the two types of pattern data for the A and B layers are composited. When a conventional mask without utilizing a phase shifter is produced, the design process for pattern data is completed at step 708.

Figure 4:
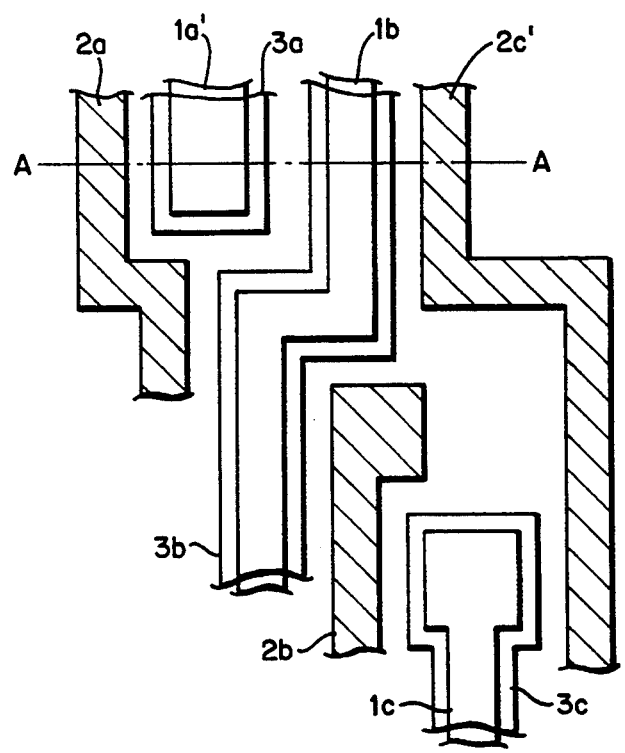
FIG. 4 represents a fourth step of the design rule checking method according to the example of the invention.

However, when a phase shift mask necessitates an additional step for forming a phase shifter (step 709), pattern data for the phase shifter is produced in the following manner. As shown by the reference numerals 3a, 3b and 3c in FIG. 4, pattern data for the phase shifter is produced by enlarging the light transmitting portions 1a', 1b and 1c defined by the pattern data for the A layer by a predetermined amount. The amount for enlargement is determined by the accuracy of registration of the mask drawing apparatus, the pattern edge profile of the resist used in producing the mask, a process margin for etching a silicon oxide film which becomes a phase shifter, and the like. If the amount for enlargement exceeds the minimum space width of the design rules, the pattern data for the phase shifter reaches the light transmitting portion on which the phase shifter should not be formed. Therefore, the amount for enlargement cannot exceed the minimum space width of the design rules. In this example, the pattern data for the phase shifter is produced by setting the amount for enlargement as 0.2 μm. Thus, the design rule checking for a phase shift mask is completed.

Figure 5A:
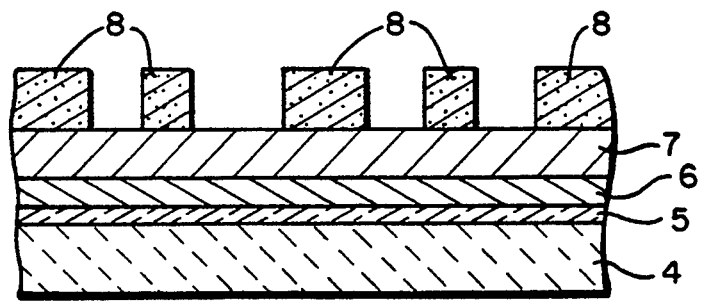
FIGS. 5A to 5C represent a fabrication process procedure of a phase shift mask according to the example of the invention.
Figure 5B:
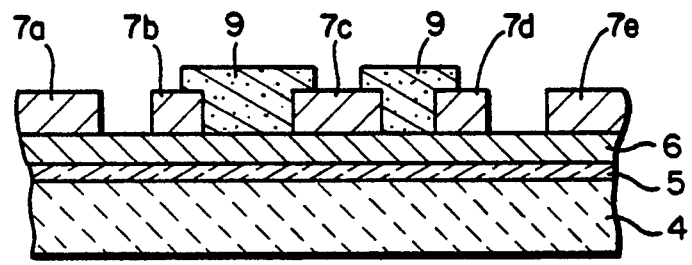
Figure 5C:
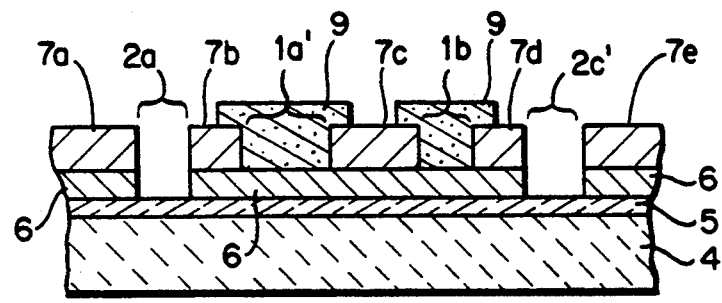

Masks or reticles are fabricated using the thus produced pattern data by lithographic and etching techniques. With reference to FIGS. 5A to 5C, the production of masks is further described. FIGS. 5A to 5C show sectional views taken along the line A—A in FIG. 4. A blank mask is employed. In the blank mask, a transparent conductive film 5, a silicon oxide film 6 and a chromium film 7 are sequentially deposited on a quartz substrate 4. Since the silicon oxide film 6 is used as a phase shifter, the thickness thereof is set to be 397 nm in the case where the light source is an i-line and the refractive index of the silicon oxide film is 1.46, in order to shift the phase of the transmitted light by 180 degrees. As shown in FIG. 5A, first, the pattern which defines the light transmitting portions produced in step 708 of FIG. 6 is transferred by a lithographic technique, so that a resist 8 is formed. Then, the chromium film 7 is etched by an etching technique. As a result, chromium films 7a, 7b, 7c, 7d and 7e are formed.

Next, the phase shifter pattern produced in step 709 is transferred by the lithographic technique. As shown in FIG. 5B, a resist 9 which is formed by the phase shifter pattern does not cover all of the top faces of the chromium films 7b, 7c and 7d. However, the chromium films 7a, 7b, 7c, 7d and 7e themselves function as a mask, so that the silicon oxide film 6 is etched as shown in FIG. 5C. Thus, the light transmitting portions 2a and 2c' and the light transmitting portions 1a' and 1b on which a phase shifter is located are formed.

As described above, according to the invention, pattern data for the whole layer is divided into two types of pattern data for the two layers. The design rule checking is performed for each of the types of pattern data and for the combination of the types of pattern data. Thus, the design rule checking for a phase shift mask can be performed.

In the above example, the pattern data for a whole layer is designed using a conventional CAD tool in step 701 of FIG. 6. Alternatively, pattern data for the A layer including light transmitting portions with a phase shifter and pattern data for the B layer including light transmitting portions without a phase shifter may previously and separately be designed using the CAD tool, as represented in step 702 of FIG. 6.

In the above example, the pattern of the phase shifter is produced by enlarging the pattern of the A layer. In an alternative way, a pattern is first produced using the pattern of the B layer, and then the pattern is reversed to be a phase shifter pattern. One of the two ways which necessitates a shorter time period to produce pattern data is selected.

The phase shift mask may be produced by a method other than the method used in the above example, and the phase shifter may be a light transmitting film of a material other than a silicon oxide.

Although the present invention is described above primarily in the context of two different types of data representing the presence or absence of a phase shift, respectively, it will be appreciated that different criteria for defining such types of data can be applied without departing from the scope of the invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A design rule checking method by which it is checked to see whether pattern data for forming a layer of a phase shift mask satisfies design rules, the method comprising the steps of:
    generating the pattern data for forming the layer;
    dividing the pattern data into two types of pattern data for an A layer and a B layer, respectively;
    establishing A rules to be satisfied by the pattern data for the A layer, B rules to be satisfied by the pattern data for the B layer, and AB rules to be satisfied by a combination of the two types of pattern data for the A and B layers;
    automatically checking whether the pattern data for the A layer satisfies the A rules, whether the pattern data for the B layer satisfies the B rules and whether the combination of the two types of pattern data for the A and B layers satisfies the AB rules; and
    modifying the pattern data based on the checking step, wherein a phase of light transmitted through a light transmitting portion defined by the pattern data for the A layer is shifted relatively to a phase of light transmitted through a light transmitting portion defined by the pattern data for the B layer by a prescribed angle.

2. A design rule checking method according to claim 1, wherein the prescribed angle is 180 degrees.

3. A method according to claim 1, wherein the A, B, and AB rules are established using conventional resist pattern design checking software.

4. A design rule checking method by which it is checked to see whether pattern data for forming a layer of a phase shift mask satisfies design rules, the pattern data including two types of pattern data for an A layer and a B layer, respectively, the method comprising the steps of:
    generating the pattern data for forming the layer;
    establishing A rules to be satisfied by the pattern data for the A layer, B rules to be satisfied by the pattern data for the B layer, and AB rules to be satisfied by a combination of the two types of pattern data for the A and B layers;
    automatically checking whether the pattern data for the A layer satisfies the A rules, whether the pattern data for the B layer satisfies the B rules and whether the combination of the two types of pattern data for the A and B layers satisfies the AB rules; and
    modifying the pattern data based on said checking step, wherein a phase of light transmitted through a light transmitting portion defined by the pattern data for the A layer is shifted relatively to a phase of light transmitted through a light transmitting portion defined by the pattern data for the B layer by a prescribed angle.

5. A design rule checking method according to claim 4, wherein the prescribed angle is 180 degrees.

6. A method according to claim 4, wherein the A, B, and AB rules are established by conventional resist pattern design checking software.

7. A method for fabricating a phase shift mask on a transmitting substrate comprising the steps of:
    generating pattern data for a layer having at least one light transmitting portion and at least one light transmitting portion including a phase shift;
    dividing the pattern data into two types of pattern data for an A layer and a B layer, respectively, the pattern data for the A layer representing the at least one transmitting portion including a phase shift in said layer, and the pattern data for the B layer representing the at least one light transmitting portion in the layer;
    establishing A rules to be satisfied by the pattern data for the A layer, B rules to be satisfied by the pattern data for the B layer, and AB rules to be satisfied by a combination of the two types of pattern data for the A and B layers;
    checking whether the pattern data for the A layer satisfies the A rules, whether the pattern data for the B layer satisfies the B rules and whether the combination of the two types of pattern data for the A and B layers satisfies the AB rules; and
    fabricating a light transmitting portion with a phase shift defined by the pattern data for the A layer and a light transmitting portion defined by the pattern data for the B layer, respectively, on the transmitting substrate.

8. A method according to claim 7, wherein a phase of light which is transmitted through the light transmitting portion defined by the pattern data for the A layer is shifted relative the phase of light which is transmitted through a light transmitted portion defied by the pattern data for the B layer by 180 degree.

9. A method according to claim 7, wherein the A, B, and AB rules are established by conventional resist design checking software.

10. A method according to claim 7, further comprising: enlarging one of the A and B layers to form a phase shifter.

11. A method for electrically analyzing pattern data for forming a mask layer of a phase shift mask in the production of a semiconductor device that satisfies design rules, comprising:
    automatically dividing the pattern data into two types of pattern data for a first mask layer and a second mask layer, respectively;
    establishing a first set of software rules to be satisfied by the pattern data for the first mask layer, a second set of software rules to be satisfied by the pattern data for the second mask layer, and a third set of software rules to be satisfied by a combination of the two types of pattern data for the first and second mask layers;

automatically checking whether pattern data for the first mask layer satisfies the first set of software rule, whether pattern data for the second mask layer satisfies the second set of software rules, and whether the combination of the two types of pattern data for the first and second mask layers satisfies the third set of software rules; and modifying the pattern data based on the checking step, wherein a phase of light transmitted through a light transmitting portion defined by the pattern data for the first layer is shifted relatively to a phase of light transmitted through a light transmitting portion defined by the pattern data for the second layer by a prescribed angle.

12. A method according to claim 11, wherein the prescribed angle is 180 degrees.

13. A method according to claim 11, wherein the first, second, and third sets of software rules are established using conventional resist pattern design checking software.

14. A method for electrically analyzing pattern data for forming a mask layer of a phase shift mask in the production of a semiconductor device that satisfies layout design rules, the pattern data including two types of pattern data for a first mask layer and a second mask layer, respectively, the method comprising the steps of:

establishing a first set of conditions to be satisfied by the pattern data for the first mask layer, a second set of conditions to be satisfied by the pattern data for the second mask layer, and a third set of conditions to be satisfied by a combination of the two types of pattern data for the first and second mask layers; and automatically checking whether pattern data for the first mask layer satisfies the first set of conditions, whether pattern data for the second mask layer satisfies the first set of conditions, whether pattern data for the second mask layer satisfies the second set of conditions, and whether the combination of the two types of pattern data for the first and second mask layers satisfies the third condition, wherein a phase of light transmitted through a light transmitting portion defined by the pattern data for the first layer is shifted relatively to a phase of light transmitted through a light transmitting portion defined by the pattern data for the second layer by a prescribed angle.

15. A method according to claim 14, wherein the prescribed angle is 180 degrees.

16. A method according to claim 14, wherein the first, second, and third sets of conditions are established by conventional resist pattern design checking software.

17. An electronically-controlled method for fabricating a phase shift mask on a light transmitting substrate comprising:

using a CAD tool, automatically generating pattern data for a mask layer having at least one light transmitting portion without a phase shift and at least one light transmitting portion including a phase shift;

automatically dividing the pattern data into two types of pattern data for an A layer and a B layer, respectively, pattern data for the A layer representing the at least one transmitting portion including a phase shift in the A layer, and pattern data for the B layer representing the at least one light transmitting portion without a phase shift in the B layer;

establishing A rules to be satisfied by the pattern data for the A layer, B rules to be satisfied by the pattern data for the B layer, and AB rules to be satisfied by a combination of the two types of pattern data for the A and B layers;

automatically checking whether pattern data for the A layer satisfies the A rules, whether pattern data for the B layer satisfies the B rules, and whether the combination of the two types of pattern data for the A and B layers satisfies the AB rules; and fabricating a light transmitting mask portion with a phase shift defined by pattern data for the A layer and a light transmitting portion without a phase shift defined by pattern data for the B layer, respectively, on the light transmitting substrate.

18. A method according to claim 17, wherein a phase of light transmitted through the light transmitting portion defined by the pattern data for the A layer is shifted by 180 degrees relative the phase of light which is transmitted through a light transmitted portion defined by the pattern data for the B layer.

19. A method according to claim 17, wherein the A, B, and AB rules are established by conventional resist design checking software.

20. A method according to claim 17, further comprising: enlarging one of the A and B layers to form a phase shifter.

* * * * *